United States Patent
Conrardy et al.

(10) Patent No.: US 9,755,200 B2
(45) Date of Patent: *Sep. 5, 2017

(54) EQUIPMENT CABINET

(71) Applicant: C & C Power Inc., Carol Stream, IL (US)

(72) Inventors: N William Conrardy, Aurora, IL (US); Christopher D. Heinz, McHenry, IL (US); Michael T. Osko, Elgin, IL (US); William Fechalos, Naperville, IL (US)

(73) Assignee: C & C PWERE, INC., Carol Stream, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/062,682

(22) Filed: Mar. 7, 2016

(65) Prior Publication Data
US 2016/0190528 A1 Jun. 30, 2016

Related U.S. Application Data

(63) Continuation of application No. 14/249,877, filed on Apr. 10, 2014, now Pat. No. 9,301,408, which is a (Continued)

(51) Int. Cl.
*H05K 7/00* (2006.01)
*H01M 2/10* (2006.01)
(Continued)

(52) U.S. Cl.
CPC .......... *H01M 2/1077* (2013.01); *G06Q 30/00* (2013.01); *H05K 5/00* (2013.01);
(Continued)

(58) Field of Classification Search
CPC ... H01M 2/1077; H01M 2/1016; H05K 7/183
(Continued)

(56) References Cited

U.S. PATENT DOCUMENTS

| 1,733,406 A | 10/1929 | Goulet |
|---|---|---|
| 1,823,396 A | 9/1931 | Goulet |

(Continued)

FOREIGN PATENT DOCUMENTS

| CN | 2548265 Y | 4/2003 |
|---|---|---|
| DE | 87 02 779.8 | 9/1987 |

(Continued)

OTHER PUBLICATIONS

Third Party Requestor Comments After Action Closing Prosecution; Dec. 18, 2013; Filed in Reexam Control No. 95/002,323, U.S. Pat. No. 8,100,271; 36 pp.

(Continued)

*Primary Examiner* — Daniel Rohrhoff
(74) *Attorney, Agent, or Firm* — Brinks Gilson & Lione

(57) ABSTRACT

An equipment cabinet having a corrugation in the side panels is disclosed. The panels are affixed to a base by bolting or welding so as to be disposed opposite each other. Holes are provided in opposing surfaces the so that cross members may be secured in a position between the opposing side panels of the cabinet to form a support structure for equipment, such as batteries. Equipment may also be attached using mounting brackets. An equipment retaining bracket includes a retaining cross member, an L-shaped bracket and a bolt to joint the retaining cross member and the L-shaped bracket so as to secure the battery in two dimensions. Retaining brackets may be provided at the front and the rear surfaces of the equipment and, in cooperation with the cross members, retain the equipment in the cabinet.

20 Claims, 8 Drawing Sheets

Related U.S. Application Data continuation of application No. 11/799,626, filed on May 2, 2007, now Pat. No. 8,721,010.

(60) Provisional application No. 60/798,094, filed on May 5, 2006.

(51) Int. Cl.
   *H05K 7/18* (2006.01)
   *G06Q 30/00* (2012.01)
   *H05K 5/00* (2006.01)

(52) U.S. Cl.
   CPC ........ *H05K 7/183* (2013.01); *Y10T 29/49108* (2015.01); *Y10T 29/5313* (2015.01)

(58) Field of Classification Search
   USPC ............. 312/257.1, 265.5, 223.1, 213; 361/724–727; 211/26, 26.2, 187, 190, 211/189
   See application file for complete search history.

(56) References Cited

U.S. PATENT DOCUMENTS

| | | | |
|---|---|---|---|
| 1,911,368 A | 5/1933 | Kress | |
| 2,108,122 A | 2/1938 | Hall | |
| 2,129,396 A * | 9/1938 | Archer | A47F 5/0018 108/27 |
| 2,147,759 A * | 2/1939 | Sulentic | A47B 57/16 211/128.1 |
| 2,160,102 A | 5/1939 | Hull | |
| 2,577,101 A | 12/1951 | Ball et al. | |
| 2,781,918 A | 2/1957 | Palm, Jr. | |
| 2,798,617 A | 7/1957 | Schreiber | |
| 2,959,715 A | 11/1960 | Leonchick | |
| D191,249 S | 8/1961 | Gardner et al. | |
| 3,102,640 A | 9/1963 | Keller | |
| 3,341,270 A | 9/1967 | Sohl | |
| 3,394,973 A | 7/1968 | Scott | |
| 3,628,807 A | 12/1971 | Fullington et al. | |
| 4,073,556 A | 2/1978 | Wilson, Jr. | |
| 4,270,661 A | 6/1981 | Rosenband | |
| 4,274,547 A | 6/1981 | Takagi et al. | |
| 4,383,614 A | 5/1983 | Miller | |
| 4,518,088 A | 5/1985 | Passoni | |
| 4,540,222 A * | 9/1985 | Burrell | A47F 3/00 211/175 |
| 4,754,369 A | 6/1988 | Nilsson | |
| 4,785,943 A | 11/1988 | Deffner et al. | |
| 4,801,023 A | 1/1989 | Ecclestone | |
| 4,925,038 A | 5/1990 | Gajewski | |
| 4,957,829 A | 9/1990 | Holl | |
| 4,994,940 A | 2/1991 | Thouvenin et al. | |
| 5,049,701 A | 9/1991 | Vowles et al. | |
| 5,140,744 A | 8/1992 | Miller | |
| 5,197,409 A * | 3/1993 | Hammond | A47F 5/0025 119/245 |
| 5,212,024 A | 5/1993 | Klink et al. | |
| 5,284,254 A | 2/1994 | Rinderer | |
| 5,295,591 A * | 3/1994 | Slater | A47B 47/027 211/151 |
| 5,372,262 A | 12/1994 | Benson et al. | |
| 5,378,057 A * | 1/1995 | Bach | A47B 47/02 312/257.1 |
| 5,403,679 A | 4/1995 | Stone | |
| 5,437,939 A | 8/1995 | Beckley | |
| 5,589,290 A | 12/1996 | Klink et al. | |
| 5,593,048 A | 1/1997 | Johnson | |
| 5,806,948 A | 9/1998 | Rowan, Sr. et al. | |
| 5,867,372 A | 2/1999 | Shie | |
| 5,890,606 A * | 4/1999 | Kuipers | H01M 2/1077 211/186 |
| 5,979,672 A * | 11/1999 | Gemra | H02B 1/54 211/189 |
| 5,996,822 A | 12/1999 | Hopkins | |
| 6,003,692 A | 12/1999 | Kozak | |
| 6,006,925 A | 12/1999 | Sevier | |
| 6,053,114 A | 4/2000 | Villanueva | |
| 6,105,796 A | 8/2000 | Buchanan et al. | |
| 6,202,860 B1 * | 3/2001 | Ludwig | H05K 7/1425 211/189 |
| 6,238,029 B1 | 5/2001 | Marzec et al. | |
| 6,257,427 B1 * | 7/2001 | Schneid | A47B 47/027 211/189 |
| 6,310,783 B1 | 10/2001 | Winch et al. | |
| 6,451,475 B1 | 9/2002 | Sherwood | |
| 6,475,659 B1 * | 11/2002 | Heimer | H01M 2/0262 429/130 |
| 6,481,582 B1 | 11/2002 | Rinderer | |
| 6,482,541 B1 | 11/2002 | Bator et al. | |
| 6,499,817 B2 | 12/2002 | Jermain | |
| 6,563,048 B2 | 5/2003 | Holt et al. | |
| 6,598,270 B2 | 7/2003 | Larsen et al. | |
| 6,605,777 B1 | 8/2003 | Anderson et al. | |
| 6,630,660 B1 | 10/2003 | Finn | |
| 6,638,660 B2 | 10/2003 | Stone et al. | |
| 6,643,122 B1 | 11/2003 | Fontana et al. | |
| 6,644,481 B2 | 11/2003 | Dean et al. | |
| 6,653,114 B2 * | 11/2003 | Walters | C12N 13/00 205/701 |
| 6,719,150 B2 | 4/2004 | Marraffa | |
| 6,901,946 B2 | 6/2005 | Frazier | |
| 6,951,288 B2 | 10/2005 | Henderson | |
| 6,955,268 B2 * | 10/2005 | Waldron | A47F 7/145 211/194 |
| 7,124,771 B2 | 10/2006 | Frazier | |
| 7,323,271 B2 | 1/2008 | Marraffa | |
| 7,548,429 B2 | 6/2009 | Miller | |
| 7,575,828 B2 | 8/2009 | Marraffa | |
| 7,691,526 B2 * | 4/2010 | Frazier | G01M 3/186 429/100 |
| 7,740,142 B2 | 6/2010 | Miller et al. | |
| 8,721,010 B2 * | 5/2014 | Conrardy | H01M 2/1077 312/223.1 |
| 9,301,408 B2 * | 3/2016 | Conrardy | H01M 2/1077 |
| 2002/0117942 A1 | 8/2002 | Audibert et al. | |
| 2002/0153814 A1 | 10/2002 | Robideau | |
| 2002/0192543 A1 | 12/2002 | Heimer | |
| 2003/0003350 A1 | 1/2003 | Heimer et al. | |
| 2004/0079714 A1 * | 4/2004 | Andrew | H01M 2/1077 211/49.1 |
| 2004/0140276 A1 | 7/2004 | Waldron | |
| 2005/0058891 A1 * | 3/2005 | Marraffa | H01M 2/1077 429/99 |
| 2005/0084748 A1 | 4/2005 | Miller et al. | |
| 2006/0091086 A1 | 5/2006 | Canty et al. | |
| 2007/0144981 A1 | 6/2007 | Nguyen | |
| 2007/0178369 A1 * | 8/2007 | Conrardy | H01M 2/1077 429/100 |
| 2007/0278915 A1 | 12/2007 | Conrardy et al. | |
| 2008/0093958 A1 * | 4/2008 | Peterson | H04Q 1/064 312/223.1 |
| 2010/0294721 A1 * | 11/2010 | Frazier | G01M 3/04 210/660 |
| 2011/0262799 A1 | 10/2011 | Kim | |
| 2012/0088142 A1 | 4/2012 | Jan et al. | |
| 2013/0052516 A1 | 2/2013 | Kim | |
| 2013/0316212 A1 * | 11/2013 | Lee | H01M 2/0245 429/99 |
| 2015/0044538 A1 * | 2/2015 | Katayama | H01M 10/6556 429/120 |

FOREIGN PATENT DOCUMENTS

| | | |
|---|---|---|
| DE | 41 16 253 C1 | 6/1992 |
| DE | 44 07 156 C1 | 6/1995 |
| EP | 0 158 368 A2 | 10/1985 |
| EP | 0 281 710 A1 | 9/1988 |
| FR | 874.287 | 8/1942 |
| JP | 59-160954 | 9/1984 |

(56) References Cited

FOREIGN PATENT DOCUMENTS

| JP | 60-236454 | 11/1985 |
|---|---|---|
| JP | 2000-48788 | 7/1998 |

OTHER PUBLICATIONS

Amendment and Response to Non-Final Office Action from Co-Pending U.S. Appl. No. 13/614,656, dated Mar. 4, 2014 (22 pgs).
Amendment and Response to Non-Final Office Action from Co-Pending U.S. Appl. No. 13/614,656, dated Dec. 19, 2014 (13 pgs).
Final Office Action in related U.S. Appl. No. 13/614,656 mailing date Jun. 26, 2015 (14 pgs).
Response to Final Office Action in related U.S. Appl. No. 13/614,656 mailing date Aug. 25, 2015 (17 pgs).
Advisory Action in related U.S. Appl. No. 13/614,656 mailing date Sep. 15, 2015.
Non-Final Office Action in related U.S. Appl. No. 13/614,656 Mailing date Dec. 16, 2015 (11 pgs).
Response to Non-Final Office Action in related U.S. Appl. No. 13/614,656 mailing date Mar. 5, 2016 (7 pgs).
Decision to Appeal U.S. Reexamination Control No. 95/002,323, U.S. Pat. No. 8,100,271 B2, mailing date May 31, 2016; (35 pgs).
International Search Report from PCT International Application No. PCT/US2007/001093 dated Sep. 18, 2007.
Jul. 20, 2010 Non-Final Office Action, U.S. Appl. No. 11/346,042.
Response to Jul. 20, 2010 Non-Final Office Action, U.S. Appl. No. 11/346,042, filed Jan. 12, 2011.
Non-Final Office Action for related U.S. Appl. No. 11/346,042, mailing date Mar. 30, 2011.
Response to Office Action mailed Mar. 30, 2011, in related U.S. Appl. No. 11/346,042, filed Jun. 8, 2011.
Complaint filed by C&C Power, Inc. in the United States District Court for the Northern District of Illinois, dated May 3, 2012 (with Exhibits).
Defendant's Motion to Dismiss Plaintiff's Complaint, filed by C&D Technologies, Inc. et al. in the United States District Court for the Northern District of Illinois, dated Jul. 10, 2012.
Request for Inter Partes Reexamination of U.S. Pat. No. 8,100,271, filed with the United States Patent and Trademark Office dated Sep. 14, 2012.
Office Action from U.S. Re-Examination Application No. 95/002,323, dated Nov. 28, 2012.
Amendment and Response to Office Action from U.S. Re-Examination Application No. 95/002,323, dated Jan. 25, 2013.
Requestor's Response to Patent Owner's Amendment and Response to Office Action from U.S. Re-Examination Application No. 95/002,323, dated Feb. 22, 2013.
IEEE Guide for Batteries for Uninterruptible Power Supply Systems (IEEE Std 1184-2006) extract, 10 pp; The Institute of Electrical and Electronic Engineers, New York, NY, Sep. 2006.
NEC2005 "NFPA 70: National Electrical Code" extract, 4 pp; National Fire Protection Association, Quincy, MA, 2005.
Patent Owner Comments After Action Closing Prosecution; Nov. 18, 2013; Filed in Reexam Control No. 95/002,323, U.S. Pat. No. 8,100,271; 44 pp.
Action Closing Prosecution (Nonfinal) Issued Oct. 18, 2013; 72 pp.
Third Party Requester Comments After Non-Final Decision; Sep. 6, 2013; Filed in Reexam Control No. 95/002,323, U.S. Pat. No. 8,100,271; 32 pp.
Response After Nonfinal Action—Owner Timely; Aug. 9, 2013; Filed in Reexam Control No. 95/002,323, U.S. Pat. No. 8,100,271; 60 pp.
Reexamination Non-Final Action Issued Jun. 5, 2013; 32 pp.
Third Party Requester Comments After Nonfinal Action Feb. 22, 2013; Filed in Reexam Control No. 95/002,323, U.S. Pat. No. 8,100,271; 105 pp.
Response After Nonfinal Action—Owner Timely; Jan. 25, 2013; Filed in Reexam Control No. 95/002,323, U.S. Pat. No. 8,100,271; 51 pp.
Determination Reexam Ordered; Issued Nov. 28, 2012; 37 pp.
Office Action from Co-pending U.S. Appl. No. 13/354,822, dated Jun. 6, 2013, (13 pgs).
Amendment and Response to Office Action from Co-Pending U.S. Appl. No. 13/354,822, dated Oct. 3, 2013 (13 pgs).
Final Office Action from Co-pending U.S. Appl. No. 13/354,822, dated Jan. 10, 2014, (15 pgs).
Amendment and Response to Final Office Action from Co-Pending U.S. Appl. No. 13/354,822, dated Mar. 4, 2014 (17 pgs).
Final Office Action from Co-pending U.S. Appl. No. 13/614,656, dated Jun. 25, 2013, (20 pgs).
Amendment and Response to Final Office Action from Co-Pending U.S. Appl. No. 13/614.656, dated Sep. 18, 2013 (14 pgs).
Non-Final Office Action from Co-pending U.S. Appl. No. 13/614,656, dated Oct. 3, 2013, (18 pgs).
Amendment and Response to Final Office Action from Co-Pending U.S. Appl. No. 13/614,656, dated Nov. 19, 2014 (30 pgs).
Non-Final Office Action from co-pending U.S. Appl. No. 13/614,656, dated Dec. 19, 2014 (11 pgs).
Response to Final Office Action and Advisory Action with Request for Continued Examination in related U.S. Appl. No. 13/614,656 mailing date Oct. 2015 (28 pgs.).

* cited by examiner

EQUIPMENT CABINET

This application is a continuation application of U.S. patent application Ser. No. 14/249,877 filed on Apr. 4, 2014 which is a continuation application of U.S. patent application Ser. No. 11/799,626, filed on May 2, 2007 which claims the benefit of priority to U.S. provisional application 60/798,094, filed on May 5, 2006, each of which applications are incorporated herein by reference.

TECHNICAL FIELD

This application relates to an equipment cabinet or enclosure, and more specifically to a cabinet suitable for accepting storage batteries or electrical equipment and retaining the storage batteries or equipment therein.

BACKGROUND

Equipment cabinets are used to house mechanical, electronic, electrical and related equipment so that the equipment is protected from damage, and that personnel are protected from coming into contact with dangerous machinery, voltages or the like. Many equipment cabinet designs have standardized dimensions to conform to one of several industry standard equipment form factors and provide for efficient and esthetically pleasing structures and to meet a variety of environmental and durability requirements. Designs may differ in detail depending on a specific application, and may be in the from of an open structure with vertical rails on the sides to support equipment bolted into holes in the racks having standardized spacing, may have side panel closures, and may have front and rear closures. The front and rear closures may be doors, which are on hinges, and may be lockable. The terms equipment enclosure, rack, cabinet, and the like, may actually refer to a structure performing the same or similar function, or adaptable to do so. A person of skill in the art will understand that the apparatus disclosed herein is encompassed by the functional aspects of the common equivalent terminologies.

Vertical equipment support rails may be integral to the cabinet such as end posts, may be a component of structure, and may be bolted or welded together, and to a top and a base, for structural rigidity. For supporting heavy equipment, such as storage batteries, a series of longitudinal rails may be connected between the front and rear vertical rails on each side of the cabinet, and a plurality of cross-rails bolted to the longitudinal rails to create a support on which storage batteries, for example, may be placed. For equipment such as batteries, which may not be fitted with flanges or bolt holes to attach to the vertical or horizontal rails, it may be necessary to provide additional retaining structures. Such structures require a significant amount of assembly time.

In another aspect, it is known that such racks or cabinets may be provided with mounting holes in the vertical members located near the corners of the rack, and having mounting-hole spacings in accordance with one of several industry standards. For example, a spacing between pairs of holes has a period of 1.75" (44.45 mm) for equipment meeting EIA-310-D (Electronic Industries Alliance, formerly Electronic Industries Association). In this configuration, the usable height is often specified in units of "U", each one being a height interval of 1.75". Similarly, the equipment may meet an older standard (WECO, Western Electric Co.) having a periodicity of 2", or a similar standard promulgated by ESTI (European Telecommunications Standards Institute). Other aspects of the construction, such as the type and thickness of the material, and the like may be likewise defined. The typical arrangement of mounting holes is that two holes are provided for each standard height increment, and the pair of holes has a different spacing than the spacing between pairs of holes representing the height increment. This assists in determining the corresponding holes to be used on the opposite side of rack.

While it is convenient to describe the construction using standard dimensions, and combinations of structures, nothing herein is intended to suggest that the dimensions or arrangements are limited to such standard dimensions and structures, as the apparatus described herein is adaptable to a wide variety of support and enclosure applications.

SUMMARY

An equipment cabinet is described, including a base, and a pair of opposing vertical panels having corrugations in the surface thereof, with one end of each vertical panel being fastened to the base. The corrugations may be, for example, U-shaped channels oriented in a vertical direction and having holes formed in surfaces of the U-shaped channels. Equipment may be mounted in the cabinet using brackets, shelves, cross rails, and the like. Alternatively, the U-shaped channel may have holes formed in a surface thereof located between the opposing surfaces of the U-shaped channel, and be disposed to as to be engagable with an equipment tray using fasteners. The tray may be dimensioned so as to receive a plurality of storage batteries.

In an aspect, cross rails or cross members may be provided, sized and dimensioned so that a slot or hole in tab thereof may be aligned with a hole in the U-shaped channels, when the cross rail is disposed horizontally and orthogonal to the vertical panels. The cross-rails may be secured to the vertical panels by bolting or other similar fastening means. Alternatively, a shelf may be provided.

In another aspect, the holes in the U-shaped channels may be disposed with a vertical separation that is consistent with a hole pattern on a mounting bracket, suitable for attachment to a device to be mounted in the cabinet, or suitable for securing an equipment shelf to the vertical sides. The equipment may be manufactured so that the front panel thereof has holes or slots having the same spacing as that of the hole pattern in the U-shaped panel, so that the equipment may be directly attached by bolting. The rear portion of the equipment may be secured with a bracket connected to a rearward disposed U-channel, or supported by a cross member, or the like. Similarly, rack mounting slides having compatible mounting hole or slot arrangements may be connected to the vertical sides so as to permit the equipment to be translated out of the rack for servicing.

In another aspect, a retaining bracket assembly is described, including a retaining cross member, sized and dimensioned so that a slots or holes in tab thereof are alignable with holes in U-shaped channels of a pair of opposing vertical panels when the retaining cross rail is disposed horizontally. The retaining bracket assembly also has a retaining bracket having a substantially L-shaped form with a tab extension therefrom being oriented perpendicular to one face of the L-bracket. A hole may be provided in the tab and disposed opposite a hole formed in the retaining cross rail so that a bolt may be passed through each of the holes. Either a nut or a nut captivated to the hole in the retaining cross rail may be used to secure the bolt and orient the retaining bracket so as to restrain the equipment.

A method of manufacturing a battery cabinet is described, the method including: providing a base and attaching a pair of vertical panels to the base. The vertical panels are provided with a corrugation portion having apertures or holes spaced along a length thereof. A pair of cross members or a shelf may be attached to the vertical panels at a same distance above the base so as to form a shelf dimensioned to support a battery. A wiring harness suitable for connecting a plurality of batteries may be installed in the cabinet. A plurality of batteries may be placed on the shelf and connected to the wiring harness. In an alternative, an equipment support tray may be attached to the vertical panels to support a battery.

DETAILED DESCRIPTION

Exemplary embodiments may be better understood with reference to the drawings, but these examples are not intended to be of a limiting nature. Like numbered elements in the same or different drawings perform equivalent functions. When a specific feature, structure, or characteristic is described in connection with an example, it will be understood that one skilled in the art may effect such feature, structure, or characteristic in connection with other examples, whether or not explicitly stated herein.

Figure 1:
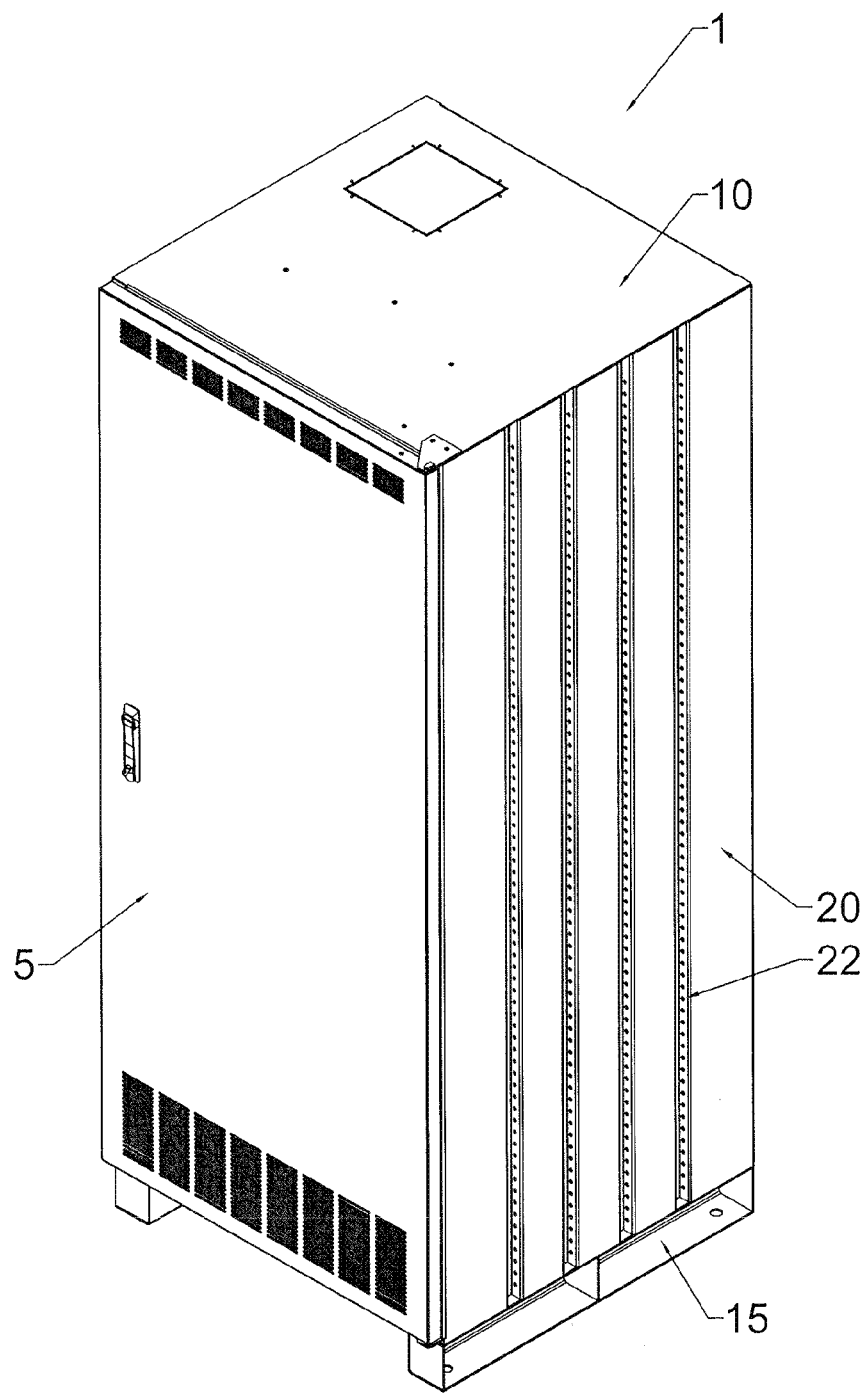
FIG. 1 is a perspective view of the equipment cabinet.

In an example, an exterior perspective view of a cabinet 1 is shown in FIG. 1, including a front door 5, top structure 10, and base structure 15. The rear panel or door is not visible in this view. The side panels 20 are shaped into a beam-like structure by a series of corrugations, or U-channels 22 formed into the surface thereof. Four such vertical U-channels 22 are shown; however, the number of U-channels 22 may be selected based on the use of the cabinet and structural requirements. The corrugated panel 20 may be formed from a metal such as steel by manufacturing processes such as cold rolling or a press brake, as is known in the art.

In an aspect, the corrugations may be formed by attaching a U-shaped channel having an everted lip to the panel surface. The everted lip may be in contact with the panel surface and attached by bolting, screwing or welding.

The side panels 20 may attach to vertical rails (not shown) at each corner of the cabinet 1. Alternatively, the panels 20 may act as the corner rails by being formed to have a stiffened end portion. The side panels 20 may be attached to a base structure 15, and a top structure 10 by bolting, screwing, welding or similar fastening technique so as to form a shell-like structure. In this manner, the overall cabinet envelope may be considered to be a hollow beam; sides of the beam that are side panels of the cabinet having U-channels contribute to increased structural stiffness in bending transverse to the surface of the panel, and may have increased buckling strength when compared with conventional flat side panels. Such an increase in bending strength may be attributed, in part, to an increase in the moment of inertia of the side panel structure. Other corrugated structural forms may also be used, such as a hat-stiffened panel.

When the cabinet 1 has a rear panel or door (not shown) in place, and a front panel or door, the overall structure may be considered a closed shell having increased structural rigidity.

Figure 2:
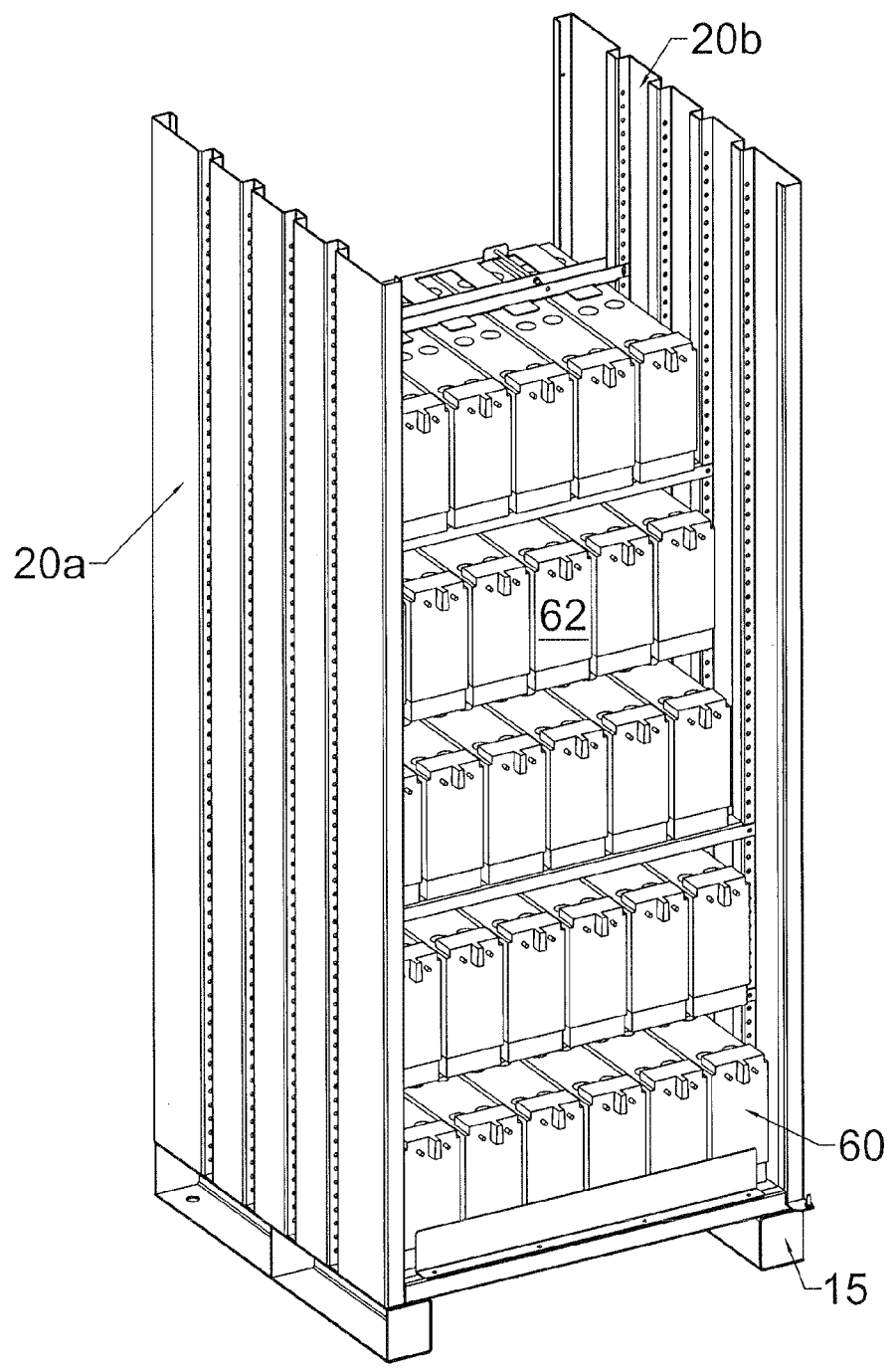
FIG. 2 is a perspective front view of an example of the equipment cabinet with the top, front and rear closures removed.
Figure 3:
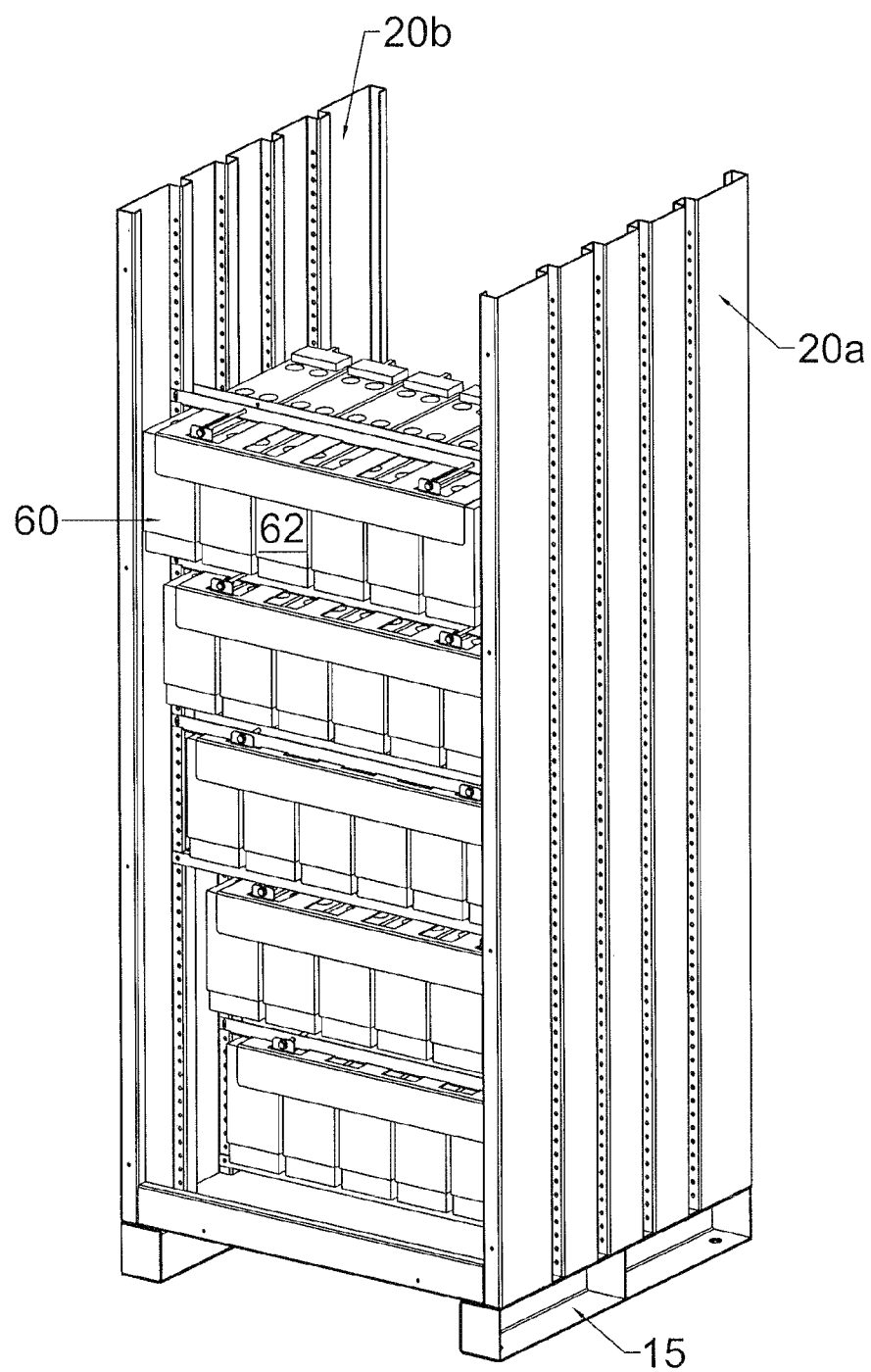
FIG. 3 is a perspective rear view of the equipment cabinet with the top, front and rear closures removed.

FIG. 2 is a front perspective view of the cabinet 1 with the top, front and rear structures removed. The cabinet 1 is shown in a configuration suitable for accommodating storage batteries 60, and five rows of six batteries 60 are shown. FIG. 3 shows the cabinet from a rear perspective view. In this example, the batteries are shown in ranks of 6 batteries disposed across the width of the cabinet. The battery ranks are disposed such that a lower rank is positioned further towards the front of the cabinet than a higher rank. This arrangement may have serviceability advantages and is described in U.S. patent application Ser. No. 11/346,042, filed on Feb. 2, 2006, entitled "Tiered Battery Cabinet" which is commonly assigned, and which is incorporated herein by reference. Other battery and equipment mounting arrangements are possible, and the stepped arrangement shown in the present example is not intended to be a limitation. The cabinet is equally suited to receive equipment stacked at a constant distance from the front of the cabinet, or a combination of mounting arrangements.

Figure 4:
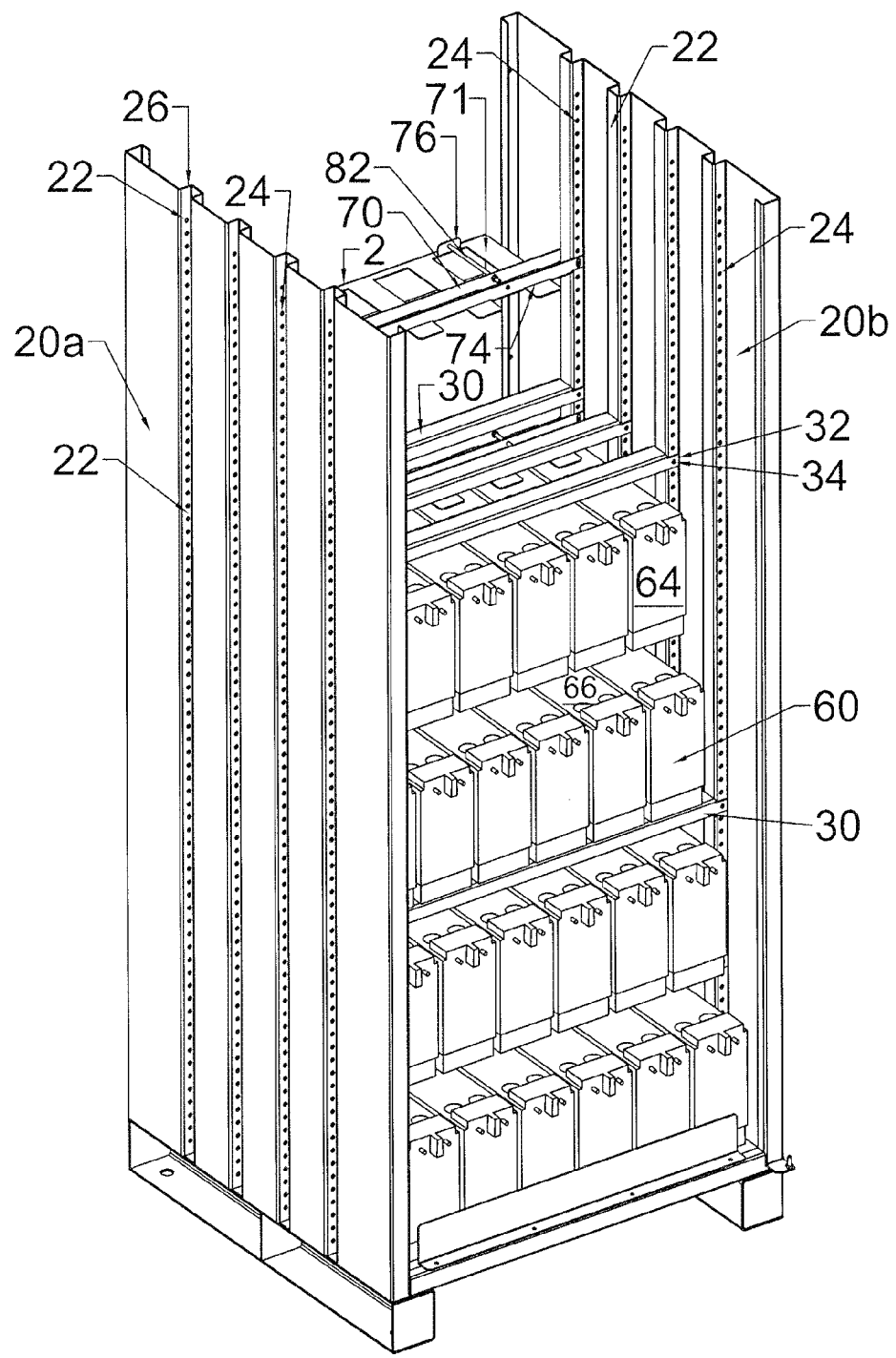
FIG. 4 is a detailed perspective view of the equipment cabinet shown in FIG. 2.

FIG. 4 is a detailed perspective view of a portion of the front of the cabinet 1. A series of holes 24 is formed in the U-channel surfaces 26. The surfaces 26 are disposed substantially perpendicular to the front-to-rear-direction of the side panel 20. The spacing of the holes 24 may depend on the specific application; however, in many applications this spacing will correspond to an industry standard such as that established by the EIA for electronic equipment. Often, the standard spacing for hole patterns in electronic equipment has a pair of holes for each attachment, and the spacing between the holes in the pair is different than the spacing between pairs of holes. In the EI specification, specifications of 0.625 inch and 0.5 inch are used. However, the holes 24 may be equally spaced, and one or more of the holes 24 may be used to secure equipment or other structures to the side panel 20. Where a U-channel 22 is used only for structural purposes, holes 24 may not be formed therein.

In an example, cross members or cross rails 30 are fitted to one or more of the vertical U-channels 22 so as to form a skeletal shelf to support the batteries 60. Each of the cross rails 30 may be a U channel, an L-channel or similar cross section, and is fitted between opposing vertical U-channels 22 in the side panels 20a, b. Each end of the cross-rails 30 may have a pair of ears 32 extending in the length direction of the cross rail 30 and may have a spacing therebetween which is greater that the longitudinal distance between opposing sides 26 of the vertical U-channel 22. The holes 34 are provided in the ears or tabs 32 of the cross rails 30, sized and dimensioned so as to create an aperture through the ears 32 and to align with the holes 24 in the vertical U-channel 22 when the ears are positioned in a height direction, the alignment being suitable for the insertion of a rod, bolt or sleeve (not shown). The rod or bolt may pass through each of the facing holes 24, 34 in the ears 32 and the U-channel 22 and secure the cross rails 30 in place. For, example, the bolt may be fitted with a nut and, the tabs 32 compressed against the opposing sides 26 of the U-channel 22. The details of the rod, bolt, sleeve, or the like, may depend on the specific use, and on strength and assembly considerations.

When a plurality of cross-rails 30 are connected between opposing side panels 20 a, b at the same height above the base 15, a shelf may be formed to support the weight of the batteries 60, or other equipment, in each rank. In the example, the batteries 60 are shown in an arrangement where the front of each rank of batteries is further from the front of the cabinet as the rank of the batteries 60 increases from the base. Depending on the rank of the battery tier, all of the vertical U-channels 22 may not be fitted with cross-rails 30 at each rank level, as the battery 60 may not extend longitudinally to a position where such cross-rails would be needed to provide support when the battery 60 is in an inserted position.

In another aspect, the U-channels 22 may protrude from the side of the panel 20 to protrude outward from the cabinet 1, and the tabs 32 in the cross rails 30 may be sized and dimensioned so that the distance between opposing tabs 32 in a cross rail 30 is less than the distance between opposing interior faces 26 of the U-channel 22 in the side vertical panel 20. In this arrangement, the tabs 32 in the cross rail 30 may be inserted into the space formed between the opposing sides 26 of the U-channel 22, and the holes 34 in the tabs 32 aligned with the holes 24 in the U-channel 22 when the cross rail 30 is in a horizontal position. The cross rail 30 may be secured to the side panel 20 using fasteners inserted into the aligned holes 24, 34, as previously described.

In yet another aspect, the distance between opposing sides of a U-shaped cross rail 30 may be less than the distance between opposing sides of the U-channel 22, and the tabs 32 may be formed by a continuation of the sides of the cross rail 30. In this circumstance, the top of the cross rail 30 may connect the two tabs 32 so that the cross rail 30 is a continuous structure between the opposing ends. This may increase the bearing strength of the section of cross rail 30 in which holes 34 are formed for the purposes of connecting the cross rail 30 to the side panel 20. Other cross sectional shapes for the cross rails 30 are also possible, such as an L-shape, or a box beam.

FIG. 4 also shows a portion of a battery retainer bracket assembly 2. As shown, the battery retainer bracket assembly 2 includes a cross-rail or cross member 70 similar to that used to support the batteries, and positioned near a rear portion of the battery rank. A retaining bracket 71 has a generally L-shaped configuration so that one side may be disposed to oppose a rear surface of the battery, and another side of the L-shaped configuration may be disposed to oppose a top surface of the battery. In this example, the side opposing the top surface of the battery is formed into a series of flat blades which are insertable into slots 74 in the U-shaped retainer cross rail 70. It is equally possible for the top surface of the retaining bracket to be formed without individual blades, and for the battery retainer cross-rail 70 to have another shape, limited only by being adapted to interface with the vertical U-channels 22 in the side panel 20.

Figure 5:
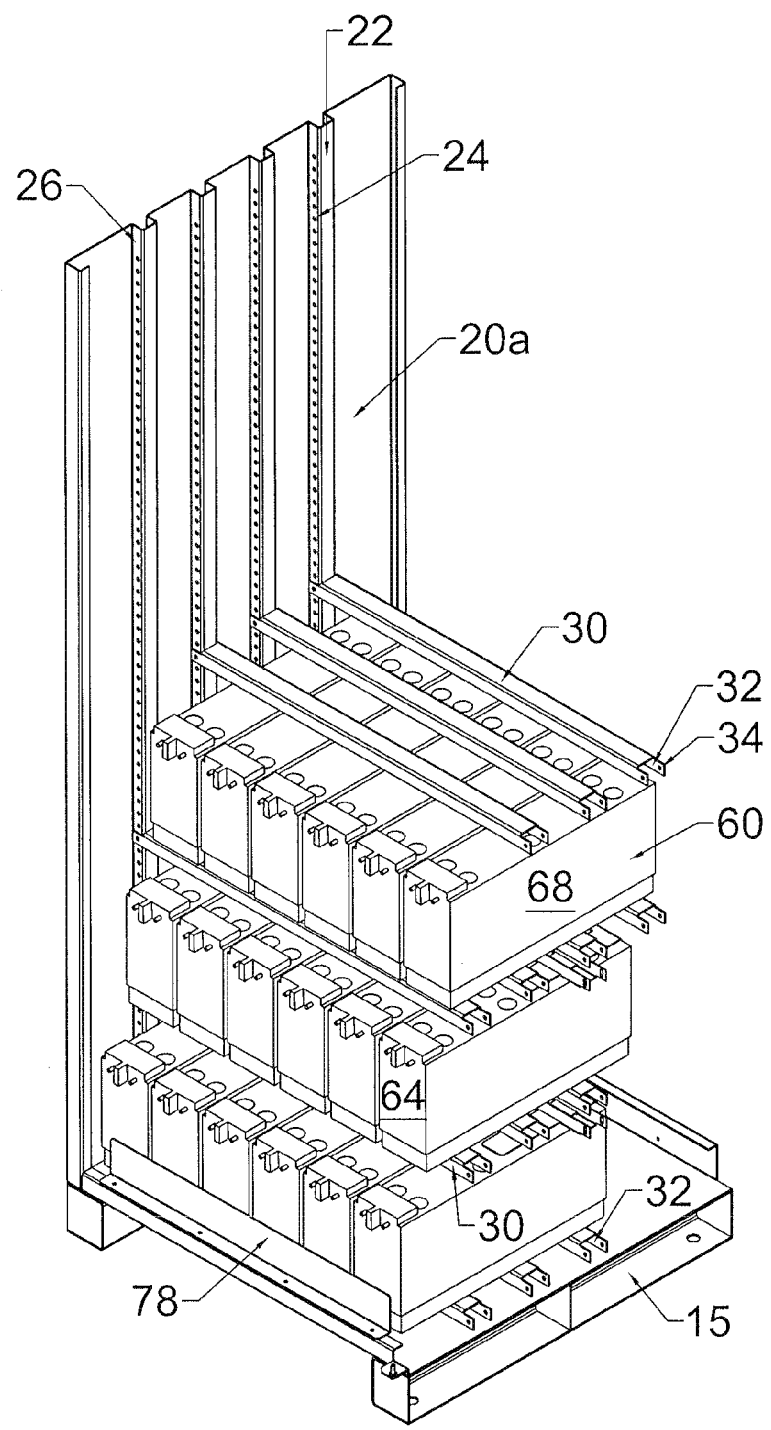
FIG. 5 is a detailed perspective view of the equipment cabinet shown in FIG. 3, with one of the side panels and some of the batteries removed.

FIG. 5 is a further perspective view of the cabinet 1, where the side 20a, retaining bracket assembly 2, and the batteries 60 of rank four have been removed to better show the details of the cross rails 30. The left-hand ends of the cross rails 30 are shown connected to the U-channels 22 of side panel 20 of the cross-rails by aligning the holes 34 in the ears 32 with the holes 24 in the U-channel 22. The batteries 60 of the first battery rank may be retained by a removable bracket 78, attached with metal screws or bolts to the base 15. Similar brackets (not shown) may be attached to the cross rails 30 of higher ranks, or webbing straps used to retain the batteries in the cabinet during shipping, and for seismic events.

Figure 6:
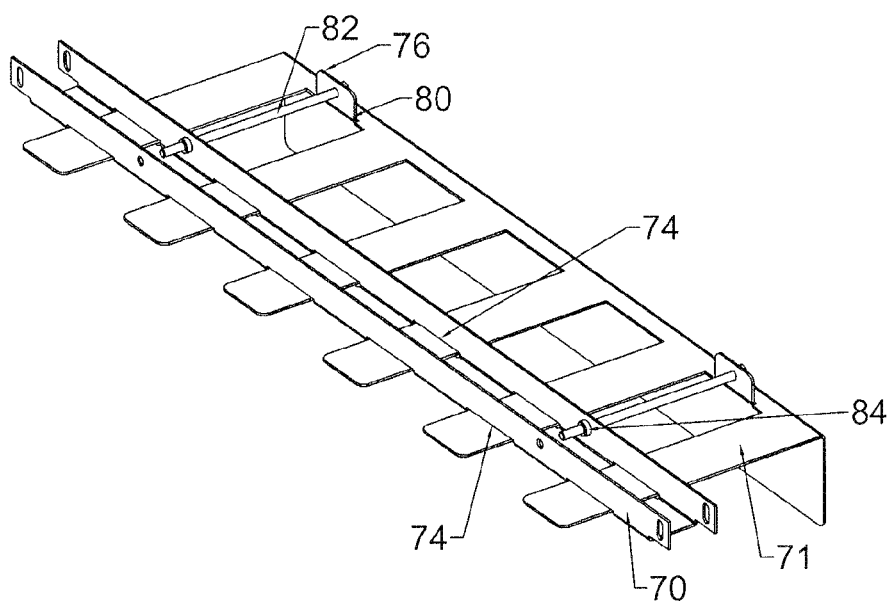
FIG. 6 is a detail perspective view of the retaining bracket assembly shown in FIG. 4.

FIG. 6 is a detailed perspective view of the retainer bracket assembly 2, including a retainer cross rail 70 and a retaining bracket 71. The retaining bracket 71 is fitted with one or more tabs 76 extending in a vertical direction and having a hole 80 therein. A bolt 82 is insertable in the hole 80 so that the bolt 82 also passes through a hole 84 in the retainer cross-rail 70. The retainer cross-rail 70 may have holes 84 in opposing surfaces of the U-channel, however only one of the pair of holes 84 may be used, depending on the position of the retainer cross-rail 70 with respect to a rear surface 62 of the battery 60 and the length of the bolt 82. The bolt 82 may be turned to draw the side of the retaining bracket 71 against the rear surface 62 of the battery 60 when the battery 60 is in the desired position. Another surface of the retaining bracket 71 opposes a top surface 66 of the battery 60.

In an aspect, the holes in the retainer cross rail 70 may be fitted with press-fit nuts 84 so that the bolt 82 may be inserted into the hole in the retainer cross-rail 70 and tightened after batteries 60 are installed in the cabinet or rack so as to adapt to the battery position. This may permit removal and replacement of individual batteries from the rear direction as well as the front direction when servicing the equipment.

A similar retaining bracket assembly 2 (not shown) may be positioned at the front of the battery 60 to retain the battery in a frontal direction. In such a configuration, the retainer cross rail 70 is disposed below the battery 60 to be retained, and the retaining bracket 71 oriented such that the flat surfaces thereof oppose a front surface 64 and an under surface of the battery 60. The combination of front and rear retaining bracket assemblies 2, cooperating with cross rails 30, may serve to retain the battery 60 securely within the cabinet, and may serve to meet structural requirements for earthquake zones.

Alternatively, a webbing or strap may be used to secure the batteries or other equipment.

Figure 7:
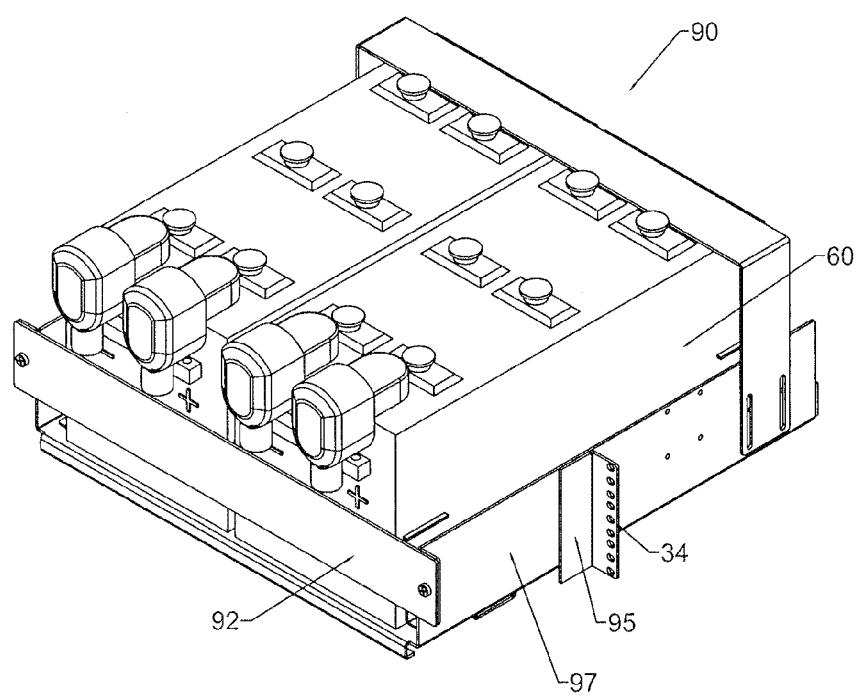
FIG. 7 is a perspective view of an equipment shelf for use with the equipment cabinet of FIG. 1.

FIG. 7 shows an example of a shelf or tray structure 90 which may be suitable for use with the cabinet 1. A tray bottom surface supports the batteries 66, and a front and rear lip, or a retaining plate 92 may be provided to retain the batteries 66. Each side of the tray 90 is provided with a side surface 97, perpendicular, and fastened to the bottom surface. The side surface 97 may be provided with a plurality of mounting holes so that an attachment bracket 95 may be fastened to the side surface 97. Groups of the plurality of holes for attaching the attachment bracket 95 to the side surface 97 may be spaced at a distance corresponding to the distance increment by which successive tiers may be set back by a horizontal distance from each other. The bracket 95 may have holes 34 disposed and spaced so that they may be aligned with holes 24 in the side panels 20.

In another aspect, the bracket 95 may be affixed directly to a chassis or case of any device that may be mounted in the cabinet. The bracket 95 is sized and dimensioned such that a pair of brackets 95, disposed on opposing sides of a device may be spaced such as to align the holes 34 with the holes 24. A nut and bolt or a screw may be used to affix the bracket 95 to the side panels 20.

In still another aspect, a wiring harness may be provided in the cabinet so that batteries positioned on the shelves may be connected in series, parallel or series-parallel to result in a product that has a voltage output and a current output and capacity meeting a specified requirement. The requirement may be expressed by a product specification or by a customer need. The connection of batteries in series results in a voltage that is the sum of the voltages of the batteries in the series string, and the connection of strings of batteries increases the current output to the sum of the currents of a battery in each of the strings. The batteries may be installed in the cabinet during the manufacture of the battery system, or be installed at the location where the cabinet is installed.

In yet another aspect, the equipment to be mounted in the cabinet 1 may be sized and dimensioned so that holes 34 in an extension of a panel of the equipment are disposed so as to be positionable with respect to holes 24 in the side panels 20, so as to permit the equipment to be directly mounted to the side panels 20 using the holes 24.

Figure 8:
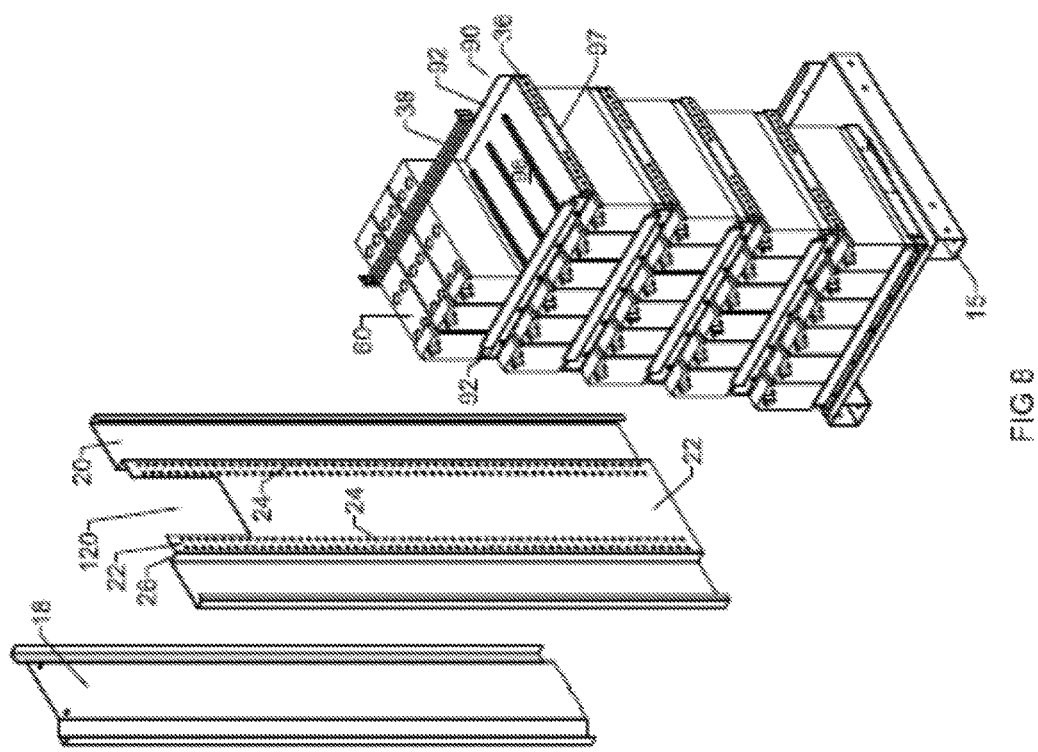
FIG. 8 is an exploded perspective view of a portion of another example of the equipment cabinet.

Another example of the equipment cabinet is shown in a partial exploded view in FIG. 8. Here the second vertical panel, the top the rear closure, and the front closure are not shown so the remainder of the details may be seen with clarity. This example is similar to the first example, and thus only the salient features will be described; the remainder will be apparent to a person of skill in the art.

The side vertical panel 20 is formed so as to have a single broad U shaped channel having side walls 26 and a bottom wall 22, and disposed within the vertical side panel 20. A cut out 120 is provided in the top of the panel 20 so that when a plurality of equipment cabinets 1 are positioned close together in a row, the cut out 120 may be used to facilitate routing of cables between the equipment cabinets.

A plurality of apertures 24 may be formed in the central wall 22 of the U-channel and where the horizontal spacing pattern of the apertures 26 is repeated in a vertical direction. The spacing between pairs of apertures 26 in the vertical and the horizontal directions may be the same distance, or a different distance. The apertures 24 may have a circular or square cross section. A square cross section may be suitable for accepting a carriage or stove bolt (not shown).

An equipment support member, which may be a shelf or tray 90, may be disposed between the vertical panels 20 and fastened thereto, so as to provide a support for equipment such as a storage battery 60. A plurality of apertures 36 may be formed in a side member of the tray 90. The apertures 36 may be spaced so that pairs of the apertures 36 may be aligned with pairs of the apertures 24. The apertures 36 may have a round or square cross section. The apertures 36 are spaced so that the tray may be disposed at a different distance with respect to the front of the equipment cabinet 1, so as to result in a staggered positioning of the trays. Alternatively, the trays may be disposed directly above one another. The tray 90 may be secured to the vertical panels 20 using bolts passed through the apertures 24 and 36 and secured by a nut. When apertures 24 and 36 have a square cross section, a carriage or stove bolt may be used. The carriage bolt has a square cross section portion adjoining the head, and this portion may engage the side panel 20 and all of, or a portion of, a thickness of the side member 36.

The tray 90 may be provided with a front and rear retaining pieces 92, where the retaining piece 92 is affixed to the horizontal portion 96 of the tray 90. The retaining piece 92 may be made of metal, or of a plastic material such as polycarbonate resin thermoplastic, which may be known, for example, by the trade name LEXAN. The front retaining piece 92 may be formed so as to have two vertical surfaces, and the vertical surfaces may be displaced horizontally from each other. When the front retaining piece 92 is mounted to the tray 90, and batteries 60 are present, a gap may be formed between the inner-facing surface of the upper vertical portion of the front retaining piece 92, and a front surface of the battery 60. Cables may be laid in this gap.

The batteries 60 may be restrained in a vertical direction by a cross piece 38, which may be a U-channel, an L-channel, or the like, and which is attachable to the side panels by a fastener. The cross piece 28 may be fitted with a resilient member on the underside thereof. A similar cross piece may be formed on the underside of each of the trays 90, or the cross piece 38 used at other levels of the equipment cabinet 1.

A fairing panel 18 may be provided, being formed so as to cover the region of the vertical panels 20 having the apertures 24. The fairing panel 18 may be attached to the vertical panel 20 by bolts, tabs or the like. Typically, this may be provided at the vertical panel 20 situated at the end of a row of cabinets.

A method of manufacturing a battery cabinet is described, the method including: providing a base and attaching a pair of vertical panels to the base. The vertical panels are provided with a corrugation portion that has apertures spaced along a length thereof. A pair of cross members or an equipment tray is attached to the vertical panels at a same distance above the base so as to form a shelf dimensioned to support a battery. A wiring harness suitable for connecting a plurality of batteries is installed in the cabinet. A plurality of batteries may be placed on the shelf and connected to the wiring harness.

The batteries may be retained in the cabinet by the combination of the cross members, and one or more retaining brackets or straps, so that the cabinet may be shipped with the batteries installed. Alternatively, a battery shelf may be provided, and the battery shelf may have brackets or straps suitable for retaining the batteries in shipment or in use.

It is therefore intended that the foregoing detailed description be regarded as illustrative rather than limiting, and that it be understood that it is the following claims, including all equivalents, that are intended to define the spirit and scope of this invention.

What is claimed is:

1. A storage battery cabinet for a power supply system, comprising:
   a base adapted to rest on a horizontal surface;
   a pair of opposing vertical panels with a vertical corrugation in a surface of each thereof, each of the pair of opposing vertical panels having a substantially rectangular perimeter, wherein the pair of opposing vertical panels are mounted with the vertical corrugation orthogonal to the horizontal surface;
   a plurality of horizontal support shelves, sized and dimensioned to support storage batteries in a single row on each horizontal support shelf; and adjacent horizontal support shelves are spaced apart in a vertical direction by at least a height of a storage battery; and
   a restraining lip associated with a horizontal support shelf of the plurality of horizontal support shelves, the restraining lip positioned such that storage batteries supported by the horizontal support shelf are restrained from motion towards a front plane of the storage battery cabinet,
   wherein a front surface of a storage battery disposed on the horizontal support shelf, when restrained by the restraining lip of the horizontal support shelf, is spaced at a greater horizontal distance from the front plane of the storage battery cabinet than the front surface of a correspondingly located storage battery on an adjacent lower horizontal support shelf of storage batteries restrained by a corresponding restraining lip of the adjacent lower horizontal support shelf.

2. The storage battery cabinet of claim 1, wherein the front surface of the storage battery is a planar vertical surface having a pair of electrical terminals disposed thereon.

3. The storage battery cabinet of claim 1, wherein the front surface of the storage battery is a planar vertical surface that is proximal to a pair of electrical terminals disposed on a planar horizontal top surface thereof.

4. The storage battery cabinet of claim 1, having at least three horizontal shelves.

5. The storage battery cabinet of claim 1, wherein each restraining lip is removably attached to a corresponding horizontal support shelf of the plurality of horizontal support shelves.

6. The storage battery cabinet of claim 1, wherein the restraining lip is removably attached to the storage battery cabinet.

7. The storage battery cabinet of claim 1, wherein the horizontal support shelf has another restraining lip at a rear end of the horizontal support shelf and the storage batteries, when restrained by the restraining lip at a front of the horizontal support shelf, are prevented from movement towards a rear of the storage battery cabinet by the another restraining lip.

8. The storage battery cabinet of claim 1, further comprising a group of storage batteries positioned in a single row on each of at least three horizontal support shelves, each of the horizontal shelves adjacent to at least one of the other horizontal shelves.

9. The storage battery cabinet of claim 8, wherein a group of storage batteries is connected in a series string using electrical cables.

10. The storage battery cabinet of claim 1, wherein the horizontal support shelves are fastened to each panel of the pair of opposing vertical panels at least two horizontally-spaced locations, the at least two horizontally spaced fastening locations spaced apart from a vertical edge of the vertical panel.

11. The storage battery cabinet of claim 1, wherein a front-to-back dimension of each horizontal storage shelf is at least equal to a maximum horizontal dimension of a storage battery of the storage batteries and is less than a front-to-back dimension of a panel of the vertical panels.

12. The storage battery cabinet of claim 1, wherein a retaining bracket is fastened to the horizontal support shelf, disposed on a surface thereof opposite to the surface supporting the storage batteries, and dimensioned to restrain a vertical motion of the storage batteries mounted on another horizontal support shelf disposed beneath the horizontal support shelf.

13. The storage battery cabinet of claim 1, wherein the restraining lip is fabricated from a plastic material.

14. The storage battery cabinet of claim 13, wherein the plastic material is a polycarbonate thermoplastic resin.

15. The storage battery cabinet of claim 1, further comprising a fairing panel, sized, dimensioned and attachable to at least one of the pair of opposing vertical panels so as to cover a region of the at least one of the pair of opposing vertical panels to which each horizontal support shelf is fastenable.

16. The storage battery cabinet of claim 1, wherein the restraining lip on a front of the horizontal support shelf and the restraining lip on another support shelf of a group of horizontal support shelves have a same fixed distance relationship with respect to a front vertical surface of the storage batteries on a first and a second horizontal support shelves of storage batteries, respectively.

17. The storage battery cabinet of claim 1, wherein at least two of the plurality of horizontal support shelves are disposed such that a front portion of a first horizontal support shelf is positioned at a first horizontal distance from a front plane of the storage battery cabinet and a front portion of a second horizontal support shelf is positioned at a second horizontal distance from the front plane.

18. The storage battery cabinet of claim 1, wherein a horizontal support shelf of the plurality of horizontal support shelves is comprised of at least two horizontal cross members, adjacent horizontal cross members spaced horizontally apart in a front-to-back dimension.

19. The storage battery cabinet of claim 18, wherein the horizontal support shelf further comprises a horizontal plate bridging the at least two horizontal cross members.

20. The storage battery cabinet of claim 1, wherein a perimeter of the base is rectangular.

* * * * *

UNITED STATES PATENT AND TRADEMARK OFFICE
CERTIFICATE OF CORRECTION

PATENT NO. : 9,755,200 B2
APPLICATION NO. : 15/062682
DATED : September 5, 2017
INVENTOR(S) : N. William Conrardy et al.

Page 1 of 1

It is certified that error appears in the above-identified patent and that said Letters Patent is hereby corrected as shown below:

On the Title Page

Left column, item (73), replace "C & C PWERE, INC." with --C & C POWER, INC.,--

Signed and Sealed this
Tenth Day of April, 2018

Andrei Iancu
*Director of the United States Patent and Trademark Office*